United States Patent
Satoh et al.

[11] Patent Number: 5,804,841
[45] Date of Patent: Sep. 8, 1998

[54] OPTICAL TRIGGER THYRISTOR AND FABRICATION METHOD

[75] Inventors: Katsumi Satoh; Kenji Ohta, both of Fukuoka, Japan

[73] Assignee: Mitsubishi Denki Kabushiki Kaisha, Tokyo, Japan

[21] Appl. No.: 648,819

[22] Filed: May 16, 1996

[30] Foreign Application Priority Data

May 17, 1995 [JP] Japan .................................... 7-118423

[51] Int. Cl.$^6$ ......................... H01L 29/74; H01L 31/111
[52] U.S. Cl. ............................ 257/117; 257/118; 257/113
[58] Field of Search ..................... 257/113, 118, 257/117

[56] References Cited

U.S. PATENT DOCUMENTS

| | | |
|---|---|---|
| 3,832,732 | 8/1974 | Roberts . |
| 4,389,534 | 6/1983 | Winterling ............................. 257/437 |
| 5,061,977 | 10/1991 | Funaba . |
| 5,083,177 | 1/1992 | Tuerkes .................................. 257/118 |
| 5,455,434 | 10/1995 | Pfirsch .................................. 257/113 |

FOREIGN PATENT DOCUMENTS

| | | |
|---|---|---|
| 0 446 439 | 9/1991 | European Pat. Off. . |
| 52-95990 | 12/1977 | Japan . |
| 58-95866 | 6/1983 | Japan . |
| 61-80855 | 4/1986 | Japan . |
| 62-291172 | 12/1987 | Japan . |

OTHER PUBLICATIONS

Patent Abstracts of Japan, vol. 006, No. 103 (E–112), Jun. 12, 1982, JP–57 035372, Feb. 25, 1982.

*Primary Examiner*—Jerome Jackson
*Attorney, Agent, or Firm*—Oblon, Spivak, McClelland, Maier & Neustadt, P.C.

[57] ABSTRACT

An optical trigger thyristor having a light receiving portion 8 constructed of an n-type base layer front surface portion 5, a p-type semiconductor region 6, and a p-type front surface layer 7. The p-type front surface layer 7 is disposed so that it connects the front surfaces of the p-type semiconductor region 6 and a p-type base layer 3 and covers the exposed surface of the n-type base layer front surface portion 5. As a result, the n-type base layer front surface portion, which tends to be easily contaminated, is covered by the p-type front surface layer. Thus, contamination of the n-type base layer front surface is prevented. Consequently, the concentration of impurities in the front surface portion of the n-type base layer does not vary. Thus, there is high arc sensitivity without deterioration of the voltage blocking characteristic.

16 Claims, 8 Drawing Sheets

OPTICAL TRIGGER THYRISTOR AND FABRICATION METHOD

BACKGROUND OF THE INVENTION

1. Field of the Invention

This invention relates to an optical trigger thyristor and a fabrication method thereof. In particular, the invention relates to a construction of a device for stabilizing a voltage blocking characteristic and for improving an optical arc sensitivity, and a fabrication method thereof.

2. Description of the Related Art

As the capacity and withstand voltage of power converting units such as DC power transmission thyristor valves increase, optical trigger thyristors are being substituted for conventional thyristors. When an optical trigger thyristor is used for a high voltage power converting unit, electric insulation as well as countermeasures against problems caused by induction can be easily performed between the main circuit and the control circuit. Thus, the size and weight of the unit can be significantly reduced.

However, only a small amount of optical energy is available for driving the optical trigger thyristor. Thus, the optical arc sensitivity needs to be improved. Japanese Patent Laid-Open Publication No. Sho 56-35311 discloses one system for improving optical arc sensitivity.

FIG. 17 is a sectional view showing a conventional optical trigger thyristor which is constructed similar to the system in the Japanese Patent Laid-Open Publication No. Sho 56-35311.

The conventional optical trigger thyristor of FIG. 17 includes: a p-type emitter layer 501; an n-type base layer 502; a p-type base layer 503; an n-type emitter layer 504; an n-type base layer front surface portion 505; and, a p-type semiconductor region 506. A light receiving portion 507 is constructed of the n-type base layer front surface portion 505 and the p-type semiconductor region 506. The conventional thyristor also includes an anode electrode 508; a cathode electrode 509 and a J1 junction 510 which is formed between the p-type emitter layer 501 and the n-type base layer 502. The J2 junction 511 is formed between the n-type base layer 502 and the p-type base layer 503. The J3 junction 512 is formed between the p-type base layer 503 and the n-type emitter layer 504.

In such an optical trigger thyristor, a blocking voltage is applied between the anode electrode 508 and the cathode electrode 509. A depletion layer extends in the n-type base layer 502. The n-type base layer front surface portion 505 is a depletion layer. Subsequently, when an optical signal with an optical intensity $\phi$ is radiated to the light receiving portion 507 of the optical trigger thyristor, carriers are generated in the light receiving portion 507. Thus, an optical current Iph starts to flow in the n-type base layer front surface portion 505 through the J2 junction 511 adjacent thereto.

The optical current Iph, denoted by an arrow at the end of a dashed line in FIG. 17, flows in the p-type base layer 503 having a horizontal resistance R1. Thus, a voltage drop occurs so that J3 junction 512 is forward biased. When the forward bias exceeds the threshold voltage of the J3 junction 512, the number electrons injected from the n-type emitter layer 504 increase causing an arc in the optical trigger thyristor.

Thus, in the conventional optical trigger thyristor shown in FIG. 17, in order to improve the optical arc sensitivity, the J2 junction 511 is formed in the vicinity of the front surface where the light intensity is strongest. In addition, a depletion layer is formed on the front surface. Thus, the optical current is increased and consequently the optical arc sensitivity is improved.

In a conventional thyristor, in order to block a voltage, a depletion layer is actively extended to the n-type base layer 502 so as to weaken the electric field. Thus, a voltage blocking characteristic is developed. Consequently, the concentration of impurities in the n-type base layer 502 should be lower than that of other layers so that the depletion layer extends to the n-type base layer 502.

The conventional optical trigger thyristor shown in FIG. 17 is fabricated by the following method. A mask that is composed of an oxide film is formed on one surface of the n-type semiconductor substrate so that only the n-type base layer front surface portion 505 remains. With the mask in place, the p-type base layer 503 and the p-type semiconductor region 506 are formed. The p-type emitter layer 501 is formed on the other surface of the n-type semiconductor substrate. Thereafter, an oxide film is formed once again. By a photomechanical process, a portion of the oxide film on the p-type base layer 503 is removed. By a heat diffusing method, the n-type emitter layer 504 is formed in the portion where the oxide film has been removed. After the oxide film is removed, aluminum is evaporated so that the anode electrode 508 and the cathode electrode 509 are formed on the p-type emitter layer 501 and the n-type emitter layer 504, respectively.

The conventional optical trigger thyristor is fabricated as described above. After the n-type base layer front surface portion 505 of the light receiving portion 507 is formed, several more steps, including a heating process, are required. Thus, the n-type base layer 502 tends to be contaminated in various ways such as by a secondary diffusion from other semiconductor layers in which impurities have been diffused in a high temperature heating process. In particular, the front surface of the n-type base layer 502 is exposed to contaminating sources. Thus, while the thyristor is being fabricated, the N type base front surface portion 505 is influenced by contamination, and thereby the impurity concentration varies.

This contamination takes place due to a substance contained in an atmospheric gas when an oxide film is formed. In addition, the contamination takes place when impurities diffuse from the p-type semiconductor layer to the n-type base layer front surface portion 505. Moreover, the contamination takes place due to an evaporation film that has not been properly etched out when the evaporation film is formed for electrodes on the n-type base layer front surface portion 505.

In an optical trigger thyristor having a varying impurity concentration in the n-type base layer front surface portion 505, when a forward voltage is applied between the anode electrode 508 and the cathode electrode 509, the depletion layer only slightly extends in the n-type base layer front surface portion 505. Thus, the depletion layer does not reach the p-type semiconductor region 506 of the light receiving portion 507. Consequently, the electric field is concentrated in the vicinity of the exposed portion of the J2 junction 511 to the semiconductor substrate main surface, and thus the voltage blocking characteristic deteriorates. Thus, a problem with the conventional thyristor is the failure to stably provide a predetermined voltage blocking characteristic.

SUMMARY OF THE INVENTION

The present invention solves the above-described problem by providing an optical trigger thyristor for maintaining the optical arc sensitivity and voltage blocking characteristic, and a fabrication method thereof.

An optical trigger thyristor according to the invention includes: a first conductor type semiconductor substrate having a first and a second main surface side and; a second conductor type first semiconductor layer disposed on a part of the front surface on the first main surface side of the semiconductor substrate. A first conductor type second semiconductor layer is disposed in an island shape on a front surface of the first semiconductor layer and a second conductor type third semiconductor layer is disposed in an island shape on a part of the front surface on the first main surface side of the semiconductor substrate. The first and second layer form a part of a light receiving portion while a second conductor type fourth semiconductor layer, adapted for connecting the third semiconductor layer and the first semiconductor layer, function as another part of the light receiving layer, with the fourth semiconductor layer have a depth which is shallower than the depth of the third semiconductor layer disposed on a part of the front surface. A second conductor type fifth semiconductor layer is disposed on a front surface of the second main surface side of the semiconductor substrate and a first main electrode, adapted for connecting the first semiconductor layer and the second semiconductor layer, is disposed on the first main surface side of the semiconductor substrate. A second main electrode is connected to the fifth semiconductor layer and disposed on a front surface of the fifth semiconductor layer.

Another optical trigger thyristor according to the invention includes: a first conductor type semiconductor substrate having a first and a second main surface side. A second conductor type first semiconductor layer is disposed on a first part of a front surface on the first main surface side of the semiconductor substrate so that the first semiconductor layer surrounds a second part of the front surface and a first conductor type second semiconductor layer is disposed in an island shape on the front surface of the first semiconductor layer along the periphery of first part of the front surface of the semiconductor substrate. A second conductor type third semiconductor layer is disposed in an island shape on the second part of the front surface of the semiconductor substrate surrounded by the first semiconductor layer, and forms a part of a light receiving portion. A second conductor type fourth semiconductor layer, adapted for connecting the third semiconductor layer and the first semiconductor layer, forms another part of the light receiving portion, and the fourth layer has a depth which is shallower than the depth of the third semiconductor layer disposed on the second part of the front surface. A second conductor type fifth semiconductor layer is disposed on the front surface of the second main surface of the semiconductor substrate and a first main electrode, adapted for connecting the first semiconductor layer and the second semiconductor layer, is disposed on the first main surface of the semiconductor substrate. A second main electrode is connected to the fifth semiconductor layer, and is disposed on the front surface of the fifth semiconductor layer.

A fabrication method of an optical trigger thyristor according to the invention, includes forming a first insulation film on a first main surface of a first conductor type semiconductor substrate having first and second main surface sides. An opening is then formed in the first insulation film by a photomechanical process so that a part of the insulation film is left in a first island shape. Second conductor type impurities are injected and diffused in the first and second main surfaces with a first insulation film mask in order to form first and third semiconductor layers and a second main surface side semiconductor layer. Subsequently the first insulation film is removed. Second insulation films are then formed on each of: a third semiconductor layer corresponding to the opening of the island shape region on the first main surface of the semiconductor substrate; a first semiconductor layer formed corresponding to another opening which is the front surface of the exposed semiconductor substrate; and the front surface of the second main surface side semiconductor layer. An opening is then formed in the second insulation film on the first main surface so that a first region, which covers the island region, and the opening thereof, remains. First conductor type impurities are then injected and diffused with masks of the second insulation films of the first main surface side to form a second semiconductor layer. The second insulation films are then removed. Third insulation films are then formed on each of the front surfaces of the second semiconductor layer, the third semiconductor layer, the first semiconductor layer, the exposed semiconductor substrate, and a front surface of the second main surface side semiconductor layer. An opening is then formed in a second region corresponding to the first region of the third insulation film on the first main surface side and second conductor type impurities are injected with insulation masks covering the first main surface side so that the impurities do not reach the third semiconductor layer. The third insulation films are then removed, and conductor films are formed on each of the front surfaces of the fourth semiconductor, the first semiconductor layer, the second semiconductor layer, and the front surface of the fifth semiconductor layer. A mask is then formed for opening a part of the fourth semiconductor layer and the first conductor layer adjacent thereto by a photomechanical process. Subsequently the conductor film corresponding to the opening is removed.

Another fabrication method of an optical trigger thyristor according to the invention includes forming a first insulation film on a first main surface of a first conductor type semiconductor substrate which has first and second main surface sides and forming an opening in the first insulation film by a photomechanical process so that a part of said insulation film is left in an island shape and injecting second conductor type impurities in the first and second main surface sides with a first insulation film mask. The impurities are diffused so that an impurity region corresponding to the opening in the island region overlaps with a non-impurity region disposed adjacent to the impurity region through the semiconductor substrate in the vicinity of the front surface of the first and second main surface sides of the semiconductor substrate to form first and third semiconductor layers and a second main surface side semiconductor layer. Then the first insulation film is removed. Second insulation films are then formed on each of: the front surfaces of a third semiconductor layer formed corresponding to the opening of the island shape region on the first main surface of the semiconductor substrate; the third semiconductor layer corresponding to another opening; the first semiconductor layer partially overlapped in the vicinity of the front surface of the semiconductor substrate; and with the front surface of the second main surface side semiconductor layer. An opening is then formed in the second insulation film on the first main surface so that the insulation film of a first region which covers the island shape region and the opening thereof remains. First conductor type impurities are then injected and diffused using the second insulation film masks on the first main surface side to form a second semiconductor layer. Subsequently the second insulation films are removed. In a third step conductor films are formed on each of: the front surfaces of the second semiconductor layer; the third semiconductor layer; the first semiconductor layer; and with the front surface of the second main surface side semiconductor layer. A mask is then formed having an opening at a second region, corresponding to the first region on the conductor film, by a photomechanical process and the conductor film corresponding to the opening is then removed.

According to the optical trigger thyristor of the first aspect of the invention, because the front surface portion of the semiconductor substrate, which tends to be easily affected by contamination, is covered by the fourth semiconductor layer, the optical trigger thyristor is prevented from being contaminated and the concentration of impurities of the front surface portion of the semiconductor substrate does not vary.

According to the optical trigger thyristor of the second aspect of the invention, because the front surface portion of the semiconductor substrate, which tends to be easily affected by contamination, is covered by the fourth semiconductor layer, the optical trigger thyristor is prevented from being contaminated. The concentration of impurities at the front surface portion of the semiconductor substrate does not change. In addition, the first semiconductor layer is disposed so that it surrounds a part of the front surface of the semiconductor substrate. Moreover, because the second semiconductor layer is disposed on the first semiconductor layer along the periphery of the front surface of the semiconductor substrate surrounded by the first semiconductor layer, the optical current effectively flows in the first semiconductor layer. Thus, there is a large voltage drop in the first semiconductor layer.

According to the optical trigger thyristor of the third aspect of the invention, because the third semiconductor layer or the fourth semiconductor layer is composed of a plurality of partial regions, even if the front surface of the semiconductor substrate surrounded by the first semiconductor layer widens, the distance between each partial region of the third semiconductor layer can be properly designated.

According to the optical trigger thyristor of the fourth aspect of the invention, the third semiconductor layer or the fourth semiconductor layer is constructed of a plurality of independent partial regions. In addition, the first semiconductor layer is formed in a ring shape. Moreover, the partial regions are formed in ring shapes which are concentric circles of the first semiconductor layer. Thus, there is no wasted area corresponding to the shape of the first semiconductor layer, and there is no wasted area of the front surface of the semiconductor substrate surrounded by the first semiconductor layer. Furthermore each of the intervals of the third semiconductor layers can be properly located.

According to the optical trigger thyristor of the fifth aspect of the invention, because a plurality of partial regions are discretely formed, the area of the third semiconductor layer is smaller than the area of the front surface of the semiconductor substrate surrounded by the first semiconductor layer. Therefore, the depletion region is widened.

According to the optical trigger thyristor of the sixth aspect of the invention, because the partial regions are formed in a network shape of which three adjacent partial regions form a regular triangle, the distance between each partial region of the third semiconductor layer can be properly designated.

According to the optical trigger thyristor of the seventh aspect of the invention, because the first semiconductor layer is formed in a ring shape and one of the partial regions is formed at the center of the ring of the first semiconductor layer, the distance between each partial region of the third semiconductor layer can be properly designated corresponding to the shape of the front surface of the semiconductor substrate surrounded by the first semiconductor layer.

According to the optical trigger thyristor of the eighth aspect of the invention, the distance between the first semiconductor layer and the third semiconductor layer or the distance between each partial region of the third semiconductor layers is in the range from 70 microns to 180 microns, preferably, in the range from 90 microns to 150 microns, the arc sensitivity and voltage blocking characteristic can be well balanced.

According to the optical trigger thyristor of the ninth aspect of the invention, because the insulation film is disposed on the front surfaces of the third semiconductor layer and the fourth semiconductor layer, reflection of the optical signal can be prevented.

According to the optical trigger thyristor of the tenth aspect of the invention, because the insulation film is disposed on the front surface of the first semiconductor layer adjacent to the fourth semiconductor layer so that it is positioned between the first main electrode and the first semiconductor layer, the fourth semiconductor layer can be covered by the first main electrode. Thus, generation of a reverse bias due to the optical signal can be prevented in the fourth semiconductor layer.

According to the optical trigger thyristor of the eleventh aspect of the invention, because the insulation film extends over the junction of the first semiconductor layer and the second semiconductor layer adjacent to the fourth semiconductor layer and is disposed between the first main electrode and the first semiconductor layer, the optical signal can be effectively guided to the light receiving portion and the generation of reverse bias due to the optical signal can be prevented in the fourth semiconductor layer.

According to the optical trigger thyristor of the twelfth aspect of the invention, since the insulation film is composed of silicon oxide, silicon nitride, or tantalum oxide, the material of the insulation film can be easily obtained.

According to the optical trigger thyristor of the thirteenth aspect of the invention, since the thickness of the insulation film is given by $A-30 \leq t \leq A+30$ (unit: mm) {where A is $(2n-1)\lambda/(4N)$, n is a natural number, $\lambda$ is the center wavelength of the optical signal, N is the refractive index of the insulation film, and t is the thickness of the insulation film}, reflection of the optical signal can be prevented and the optical signal can be effectively guided to the light receiving portion.

According to the fabrication method of the optical trigger thyristor of the fourteenth aspect of the invention, because the front surface portion of the semiconductor substrate, which tends to be easily affected by contamination, is covered by the fourth semiconductor layer, the concentration of impurities of the front surface portion of the semiconductor substrate does not vary.

According to the fabrication method of the optical trigger thyristor of the fifteenth aspect of the invention, impurities are diffused so that the impurity region corresponding to the opening of the island shape region is overlapped with the non-impurity region adjacent to the impurity region through the semiconductor substrate in the vicinity of the front surface of the semiconductor substrate. Thus, the front surface portion of the semiconductor substrate, which tends to be easily affected by contamination, is covered. In addition, the front surface portion of the semiconductor substrate can be covered without need to perform a diffusion step.

Other objects and advantages of this invention will become apparent from the detailed description given hereinafter. It should be understood, however, that the detailed description and specific embodiments are provided by way of illustration only since various changes and modifications within the spirit and scope of the invention will become apparent to the those skilled in the art from this detailed description.

BRIEF DESCRIPTION OF THE DRAWINGS

In all figures, the same and the substantially same elements are the same reference numbers.

DESCRIPTION OF PREFERRED EMBODIMENTS

Figure 1:
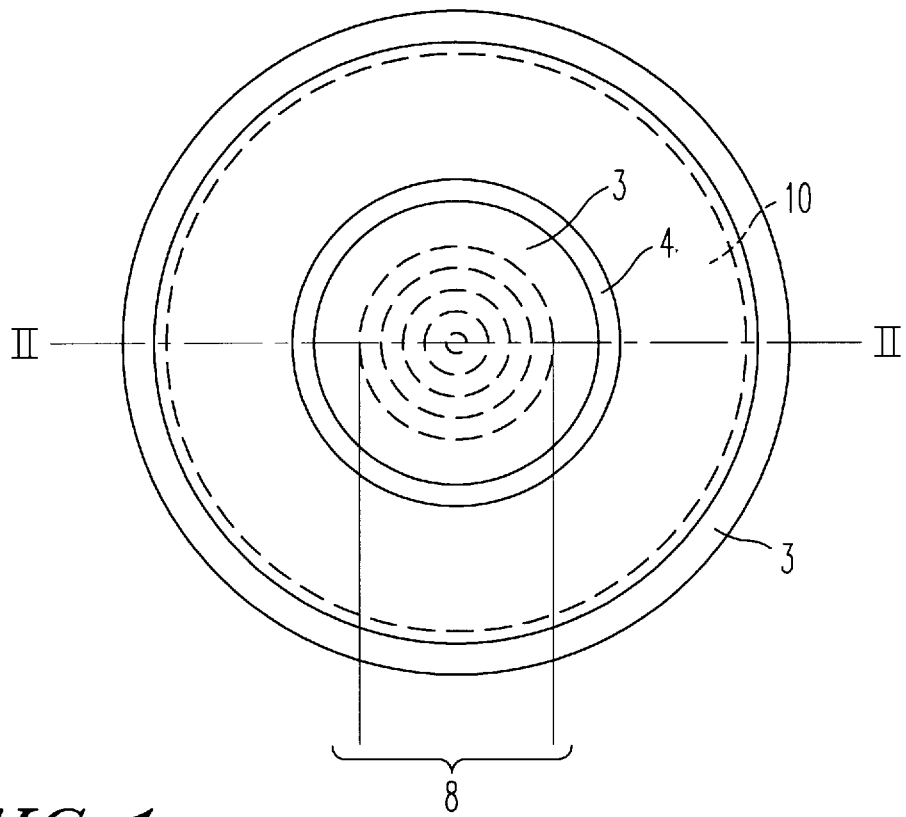
FIG. 1 is a plan view showing an optical trigger thyristor according to a first embodiment of the invention.
Figure 2:
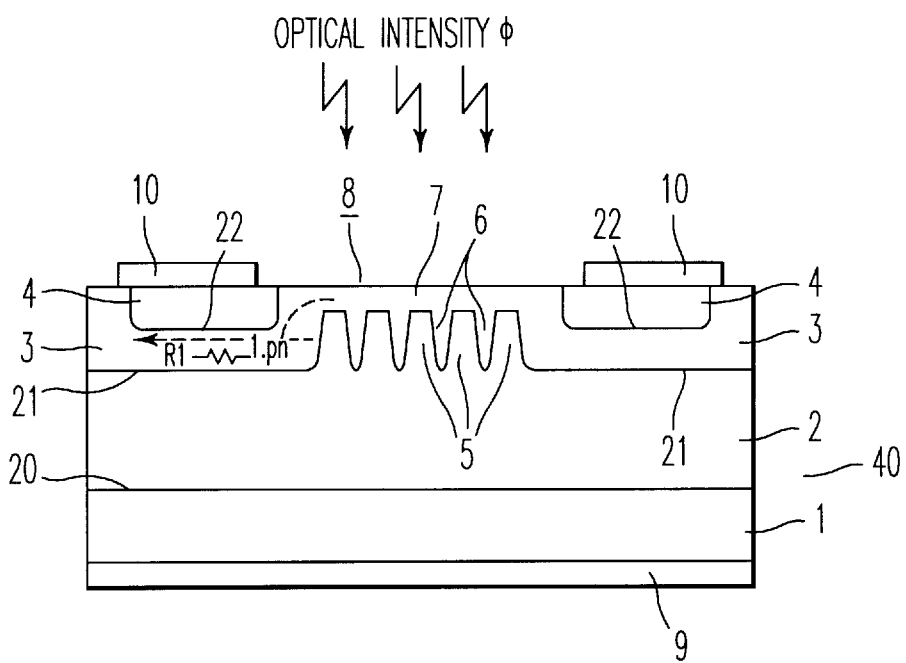
FIG. 2 is a sectional view showing the optical trigger thyristor according to the first embodiment of the invention.
Figure 3:
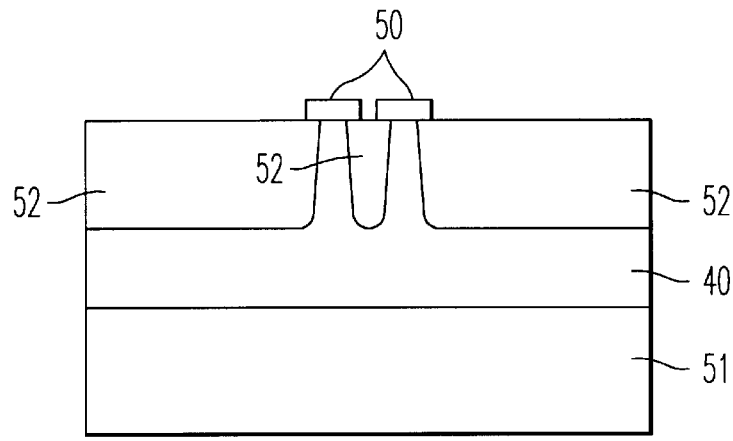
FIGS. 3 to 6 are sectional views showing the fabrication steps of the optical trigger thyristor according to the first embodiment of the invention.
Figure 4:
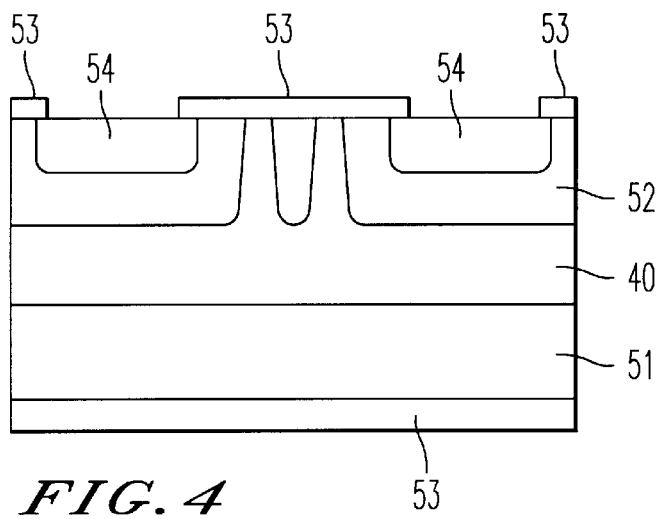

FIG. 1 is a plan view showing an optical trigger thyristor according to a first embodiment of the invention. FIG. 2 is a sectional view taken along line II—II of FIG. 1.

In FIGS. 1 and 2, an optical trigger thyristor includes: p-type emitter layer 1 as a fifth semiconductor layer; an n-type base layer 2 forming the substrate 40, a p-type base layer 3 as a first semiconductor layer; an n-type emitter layer 4 as a second semiconductor layer; an n-type base layer front surface portion 5; a p-type semiconductor region 6 as a third semiconductor layer; a p-type front surface layer 7 as a fourth semiconductor layer; a light receiving portion 8 is constructed of the n-type base layer front surface portion 5, the p-type semiconductor region 6, and the p-type front surface layer 7. The thyristor also includes an anode electrode 9; a cathode electrode 10; a J1 junction 20 between the p-type emitter layer 1 and the n-type base layer 2; a J2 junction 21 between the n-type base layer 2 and the p-type base layer 3; and a J3 junction 22 between the p-type base layer 3 and the n-type emitter layer 4. The semiconductor substrate 40 has first and second main surfaces.

The p-type emitter layer 1 is disposed on a second main surface of the semiconductor substrate 40 that is formed in a circular shape. The p-type base layer 3, which is formed in a ring shape, is disposed on the outer periphery of a first main surface which is opposite to the second main surface, but not the center portion thereof. The p-type semiconductor region 6 is disposed at the center portion of the first main surface. The p-type semiconductor region 6 is composed of a plurality of partial regions formed in ring shapes that are concentric circles of the p-type base layer 3. Since the p-type emitter layer 1 and the p-type semiconductor region 6 are formed in the same diffusing step, the depth of the p-type emitter layer 1 is almost the same as the depth of the p-type semiconductor region 6.

The n-type base layer front surface portion 5 is disposed below the p-type front surface layer 7 which connects the front surfaces of the p-type semiconductor region 6 and the p-type base layer 3, and covers the exposed surface of the n-type base layer front surface portion 5.

The p-type base layer 3 is disposed below the n-type emitter layer 4 which is a concentric circle of the p-type base layer 3. The cathode electrode 10, composed of aluminum, connects the n-type emitter layer 4 and the, p-type base layer 3, and is disposed on the outer peripheral portion of the n-type emitter layer 4 and bridges over the part of the J3 junction 22 exposed on the front surface of the n-type emitter layer 4.

The aluminum anode electrode 9 is disposed on the entire surface of the p-type emitter layer 1.

The physical dimensions of the individual portions of the optical trigger thyristor with, for example, 4 kV withstand voltage are as follows: The diameter of the light receiving portion 8 is 1 mm. The depth of the p-type base layer 3 and the p-type semiconductor region 6 measured from the front surface is in the range 90~100 microns. The distance from the J2 junction 21 and the J1 junction 20 of the p-type base layer 3 is in the range 600~700 microns. The thickness of the p-type front surface layer 7 measured from the front surface is approximately 15 microns.

In addition, the concentration of impurities in the front surface of the p-type base layer 3 and the p-type semiconductor region 6 is in the range $0.5 \sim 1.0 \times 10^{18}$ cm-3. Likewise, the concentration of impurities in the front surface of the p-type front surface layer 7 is in the range $0.5 \sim 1.0 \times 10^{18}$ cm-3.

FIGS. 3 to 6 are sectional views showing individual fabrication steps of the optical trigger thyristor according to FIGS. 1 and 2.

In the optical trigger thyristor with, for example, a 4 kV withstand voltage, an n-type semiconductor substrate 40 with the concentration of impurities of $2 \times 10^{13}$ cm-3 is used. A thermal oxide film is formed on a first main surface of the N type semiconductor substrate 40 which is formed in a disc shape. Thereafter, by a photomechanical process, the oxide film is etched out so that at least one ring shape portion of the thermal oxide film 50 remains. This ring shaped portion is a concentric circle of the disc of the semiconductor substrate 40. Thus, an opening is formed in the thermal oxide film. With a mask of the resultant thermal oxide film having the opening, p-type impurities are injected and heat diffused. A p-type semiconductor layer 52 is formed on the first main surface so that the n-type semiconductor substrate 40 is exposed just below the ring shape thermal oxide film 50 (see FIG. 3). Additionally, a p-type semiconductor layer 51 is formed on a second main surface that is the rear surface of the first main surface. Thereafter, the thermal oxide film 50 is removed and thermal oxide films 53 are newly formed on the front and rear surfaces as the first and second main surfaces of the semiconductor disc on which individual semiconductor layers have been formed. The thermal oxide film 53 on the first main surface side is etched out by the photomechanical process so that the thermal oxide film 53 remains over the exposed surface of the n-type semiconductor substrate 40 at the center of the semiconductor disc, the p-type semiconductor layer 52 surrounded by the exposed surface, the inner peripheral adjacent portion of the p-type semiconductor layer 52 that surrounds and adjoins the exposed surface of the n-type semiconductor substrate 40, and the front surface of the outermost peripheral portion of the p-type semiconductor layer 52. Thus, an opening portion is formed in the thermal oxide film.

With a mask of the thermal oxide film 53 forming the opening, n-type impurities are injected, and are diffused by the heat diffusion. Thus, an island shape n-type semiconductor layer 54, which surrounds the exposed surface of the n-type semiconductor substrate 40 at the center of the semiconductor disc, and the inner peripheral adjacent portion of the p-type semiconductor layer 52 which surrounds and adjoins the exposed surface, is formed (see FIG. 4). Thereafter, each of the heat oxide films 53 on the first and second main surfaces are removed.

Thereafter, thermal oxide films 55 are newly formed on the front and rear surfaces as the first and second main surfaces of the semiconductor disc. The thermal oxide film 55 on the first main surface side of the semiconductor substrate 40 is etched out by the photomechanical process so that the thermal oxide film 55 covers the n-type semiconductor layer 54 and the portion of the p-type semiconductor layer 52 which surrounds the n-type semiconductor layer 54. The exposed surface of the n-type semiconductor substrate 40 at the center of the semiconductor disc is exposed. Thus, an opening is formed in the thermal oxide film.

With a mask of the thermal oxide film 55 forming the opening, p-type impurities are injected, and are diffused by the heat diffusion. Thus, a p-type semiconductor layer 56 is formed on the front surface portion of the exposed portion of the n-type semiconductor substrate 40 at the center of the semiconductor disc so that the thickness of the p-type semiconductor layer 56 is smaller than that of the p-type semiconductor layer 52 (see FIG. 5). Thereafter, each of the thermal oxide films 55 on the first and second main surfaces are removed.

Before the p-type semiconductor layer 56 is formed, even if the concentration of impurities of the exposed surface of the n-type semiconductor substrate at the center of the semiconductor disc varies due to contamination, it does not significantly affect the n-type semiconductor substrate 40. Thus, when the p-type semiconductor layer 56 is formed with a predetermined concentration of impurities, the concentration of impurities of the p-type semiconductor layer 56 does not vary due to contamination. In addition, the concentration of impurities of the n-type semiconductor substrate just below the p-type semiconductor layer 56 is maintained at the normal concentration of impurities free of contamination.

Thereafter, aluminum is evaporated on the front and rear surfaces of the semiconductor disc. A resist is applied on the aluminum evaporation films. By the photomechanical process, a mask, having an opening corresponding to the p-type semiconductor layer 56 and the inner peripheral adjacent portion of the n-type semiconductor layer 54 that surrounds and adjoins the p-type semiconductor layer 56, is formed. With the mask, the aluminum evaporation film is etched out and thereby a cathode electrode 57 and an anode electrode 58 are formed (see FIG. 6).

The operation of the optical trigger thyristor shown in FIG. 2 will now be described.

When an arc takes place in the optical trigger thyristor, a blocking voltage of for example 4 kv is applied between the anode electrode 9 and the cathode electrode 10. A depletion layer extends in the n-type base layer 2. The depletion region is formed in the light receiving portion 8. When an optical signal with a light amount φ is radiated to the light receiving portion 8 of the optical trigger thyristor, carriers are generated in the light receiving portion 8. The carriers are attracted by the depletion layer. Thus, an optical current Iph starts to flow in the p-type base layer 3 through the J2 junction 21 and the p-type front surface layer 7 adjacent to the n-type base layer front surface portion 5.

In FIG. 2, the optical current Iph denoted by a dashed line arrow flows in the p-type base layer 3 through a horizontal resistance R1 thereof. Thus, a voltage drop takes place and thereby the J3 junction 22 is forward biased. When the forward bias exceeds the threshold voltage of the J3 junction 22, electrons supplied from the n-type emitter layer 4 increase. Thus, an arc takes place in the thyristor constructed of the p-type emitter layer 1, the n-type base layer 2, the p-type base layer 3, and the n-type emitter layer 4.

At this point, to improve the optical arc sensitivity, an optical signal should be effectively converted into an optical current. The light entering the light receiving portion 8 exponentially attenuates in proportion to the depth from the front surface. To effectively use the vicinity of the front surface at which the light intensity is strongest, the J2 junction is extended to the vicinity of the front surface.

In this embodiment, the p-type front surface layer 7 is formed on the n-type base layer front surface portion. And the J2 junction 21 in which the electric field is often concentrated is not exposed to the front surface. In addition, the n-type base layer front surface portion 5 which is most affected by contamination is covered by the p-type front surface layer 7. Thus, the concentration of impurities of the n-type base layer front surface portion 5 does not vary. Consequently, since the depletion layer easily extends, the concentration of electric field hardly takes place. As a result, the optical trigger thyristor according to the embodiment of the invention can accomplish high arc sensitivity and high voltage blocking characteristic.

Figure 7:
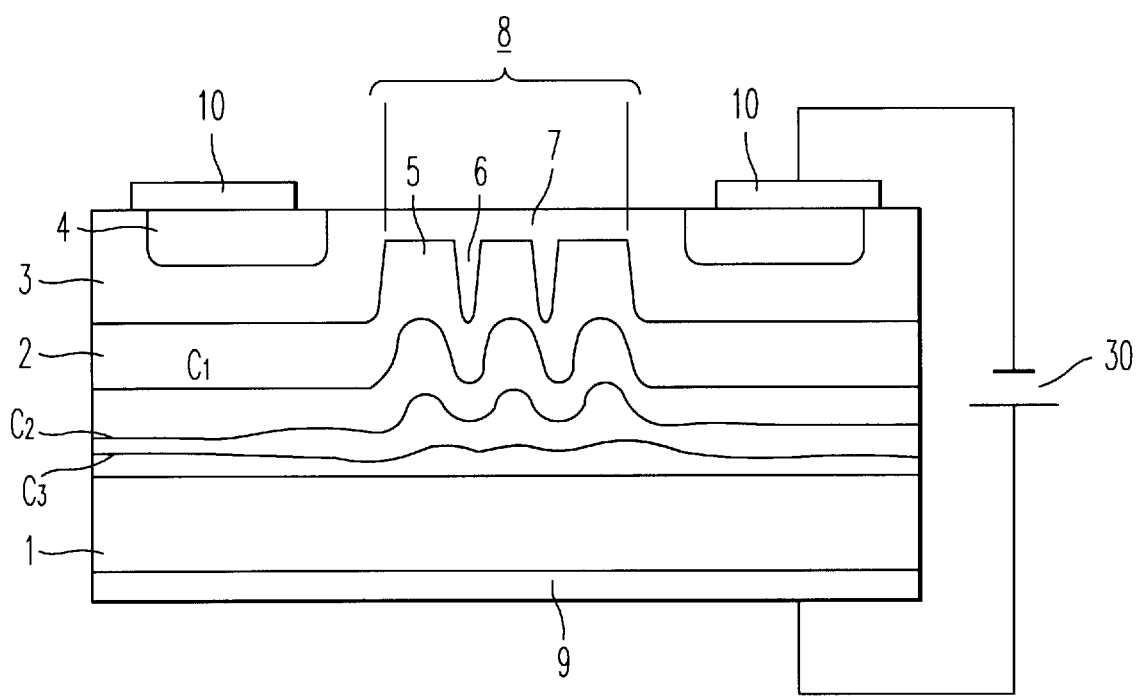
FIG. 7 is a schematic diagram showing an extension of a depletion layer when a blocking voltage is applied to the optical trigger thyristor according to the invention.

FIG. 7 is a schematic diagram showing an extension of the depletion layer in the case that a blocking voltage (of a power supply 30) is applied in the optical trigger thyristor according to the embodiment of the invention.

In FIG. 7, C1, C2, and C3 are depletion regions of the N type base layer 2 in the case that a voltage to be applied is increased.

As shown in FIG. 7, when a voltage is applied forward between the anode electrode 9 and the cathode electrode 10, a depletion layer tends to easily extend and thereby a predetermined voltage blocking characteristic can be stably obtained.

As the withstand voltage class increases and thereby the voltage blocking characteristic increases, the concentration of impurities in the n-type base layer 2 should be decreased. Thus, the p-type front surface layer 7 should be formed on the n-type base layer front surface portion 5 so as to prevent it from being contaminated.

In this embodiment, since the p-type base layer 3 surrounds the light receiving portion 8, the optical current Iph effectively flows to the p-type base layer 3. Thus, the voltage drop in the p-type base layer 3 becomes large. Consequently, the trigger sensitivity becomes high and thereby the reliability of the optical trigger thyristor is improved.

In the case that a plurality of partial regions of the p-type semiconductor region 6 are disposed for the light receiving portion, even if the n-type base layer front surface portion 5 widens, when the area of the p-type front surface layer 7 is not large and the distance between each partial region of the p-type semiconductor region 6 is proper, the electric field can be prevented from concentrating and thereby the voltage blocking characteristic can be prevented from degrading. When the p-type base layer 3 and the p-type semiconductor region 6 are disposed as concentric circles, the p-type front surface layer 7 can be disposed without a loss. Thus, the partial regions of the p-type semiconductor region 6 can be disposed corresponding to the shape of the p-type base layer 3, thereby preventing the electric field from concentrating.

Figure 8:
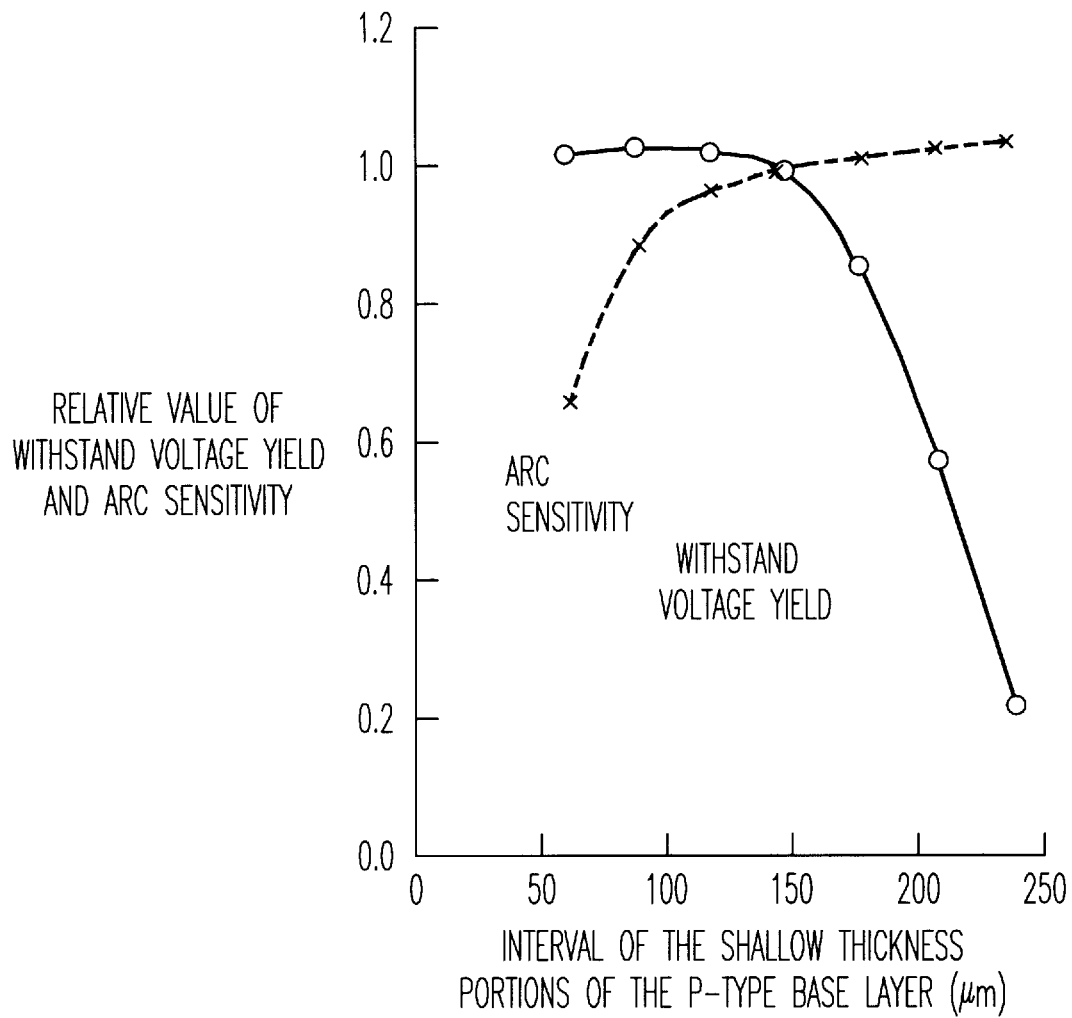
FIG. 8 is a graph showing the relationship between an arc sensitivity and a withstand voltage yield of the optical trigger thyristor according to the invention.

FIG. 8 is a graph showing the relation between an arc sensitivity and a withstand voltage yield corresponding to the width of the concentric ring shape p-type front surface layer 7 of the optical trigger thyristor according to the embodiment of the invention.

In FIG. 8, when the width of the p-type front surface layer 7 increases, the portion of the n-type base layer front surface portion 5 just below the p-type front surface layer 7 widens. Since this portion is a depletion layer in which the life time of carriers is long due to low concentration of impurities, the arc sensitivity is improved. However, when the p-type front surface layer 7 widens, electric field concentration tends to occur. Thus, the withstand voltage yield decreases. Consequently, when an optical trigger thyristor is actually designed, a proper value of the width of the p-type front surface layer 7 should be used.

As with the distance between each partial region of the P type semiconductor region 6, the proper value is in the range 70 microns~180 microns, preferably in the range 90 microns~150 microns as is clear from FIG. 8.

The proper value applies to the distance between the inner periphery of the p-type emitter layer 1 and the outer peripheral surface of the outermost p-type semiconductor region 6. This distance is in the range 70 microns~180 microns, preferably in the range of 90 microns~150 microns. Thus, the arc sensitivity and the voltage blocking characteristic can be well balanced. Thus, the reliability of the optical trigger thyristor can be improved.

Figure 9:
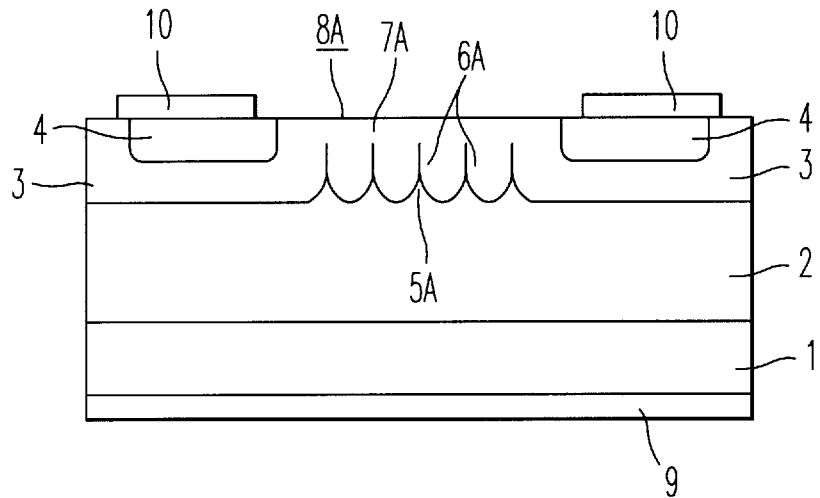
FIGS. 9 to 12 are sectional views showing an optical trigger thyristor according to a second embodiment of the invention.

FIG. 9 is a sectional view showing an optical trigger thyristor according to a second embodiment of the present invention.

In this embodiment, the partial regions of the p-type semiconductor region 6 in the first embodiment are successively formed. In other words, an n-type base layer front surface portion 5a, a p-type semiconductor region 6A, and a p-type front surface layer 7A together form a light receiving portion 8A as shown in FIG. 9. In particular, the distance between each partial region of the p-type semiconductor region 6A is significantly reduced when compared to the first embodiment. The other elements of the second embodiment are the same as that of the first embodiment.

Figure 10:
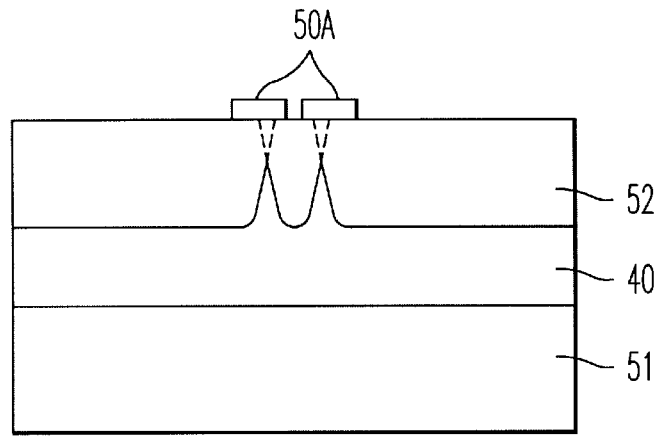
Figure 11:
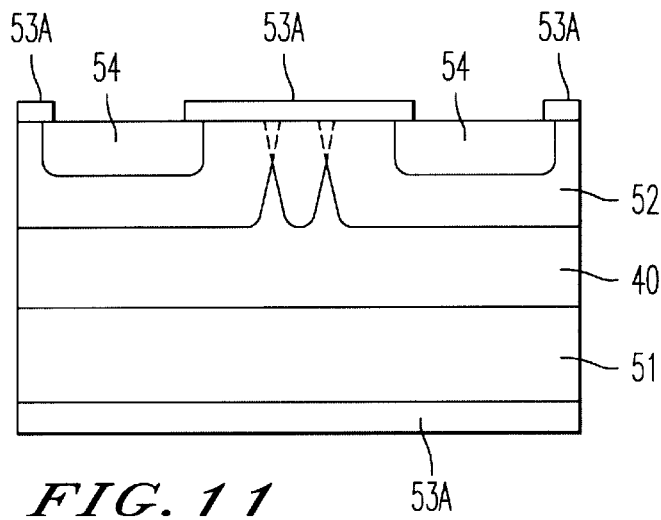
Figure 12:
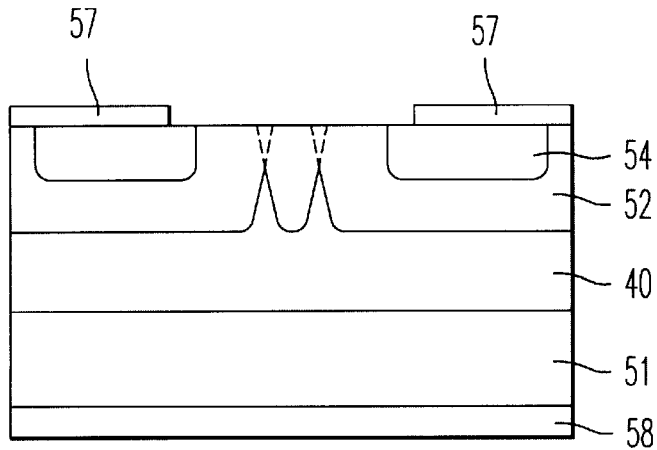

FIGS. 10 to 12 are sectional views showing individual fabrication steps of the optical trigger thyristor according to the second embodiment.

A thermal oxide film is formed on a first main surface of a disc shaped n-type semiconductor substrate 40. Thereafter, by a photomechanical process, the thermal oxide film is etched out so that at least one ring shaped thermal oxide film 50A remains which is a concentric circle of the disc of the semiconductor substrate 40. Thus, an opening is formed on the thermal oxide film. Thereafter, with a mask of the thermal oxide film 50A forming the opening, p-type impurities are injected, and diffused by the heat diffusion so that a p-type semiconductor layer 51 is formed on a second main surface that is the rear surface of the first main surface and a p-type diffusion layer is slightly overlapped just below the ring shape head oxide film 50A on the first main surface side. Thus, the p-type semiconductor layer 52 is formed (see FIG. 10). Thereafter, the thermal oxide film 50A is removed.

Thereafter, thermal oxide films 53A are newly formed on the front and rear surfaces as the first and second main surfaces of the semiconductor disc on which individual semiconductor layers have been formed. The thermal oxide film 53A on the first main surface side is etched out by the photomechanical process so that what remains is the thermal oxide film 53A on the overlap region of the p-type diffusion layer at the center of the semiconductor disc, the outer peripheral portion of the p-type semiconductor layer 52 that surrounds the overlap region, and the outermost periphery that surrounds the p-type semiconductor layer 52. Thus, an opening is formed in the thermal oxide film.

Thereafter, with a mask of the thermal oxide film 53A forming the opening portion, n-type impurities are injected, and are diffused by the heat diffusion so that an island shape n-type semiconductor layer 54 that surrounds the overlap region of the p-type diffusion layer at the center of the semiconductor disc and the outer peripheral portion of the p-type semiconductor layer 52 that surrounds the overlap region is formed (see FIG. 11). Thereafter, the thermal oxide films 53A are removed from the first and second main surfaces.

Thereafter, aluminum is evaporated on the front and rear surfaces as the first and second main surfaces of the semiconductor disc. A resist is applied on the aluminum evaporation films. By the photomechanical process, a mask having an opening corresponding to the overlap region of the P type diffusion layer at the center of the semiconductor disc, the outer peripheral portion of the p-type semiconductor layer 52 which surrounds the overlap portion, and the inner peripheral adjacent portion of the n-type semiconductor layer 54 which surrounds and adjoins the outer peripheral portion is formed. With the mask, the aluminum evaporation film is etched out so as to form a cathode electrode 57 and an anode electrode 58 (see FIG. 12).

According to the above-described fabrication method, in the diffusion step for forming the p-type semiconductor layer 52, the n-type semiconductor substrate 40 at the center of the semiconductor disc is not exposed. In addition, the p-type semiconductor layer that is thinner than the p-type semiconductor layer 52 is formed. Thus, the step for forming the p-type semiconductor layer 56 in the fabrication method according to the first embodiment can be omitted. Consequently, according to the second embodiment, since the fabrication process is simplified, the optical trigger thyristor can be fabricated at a low cost.

Figure 13:
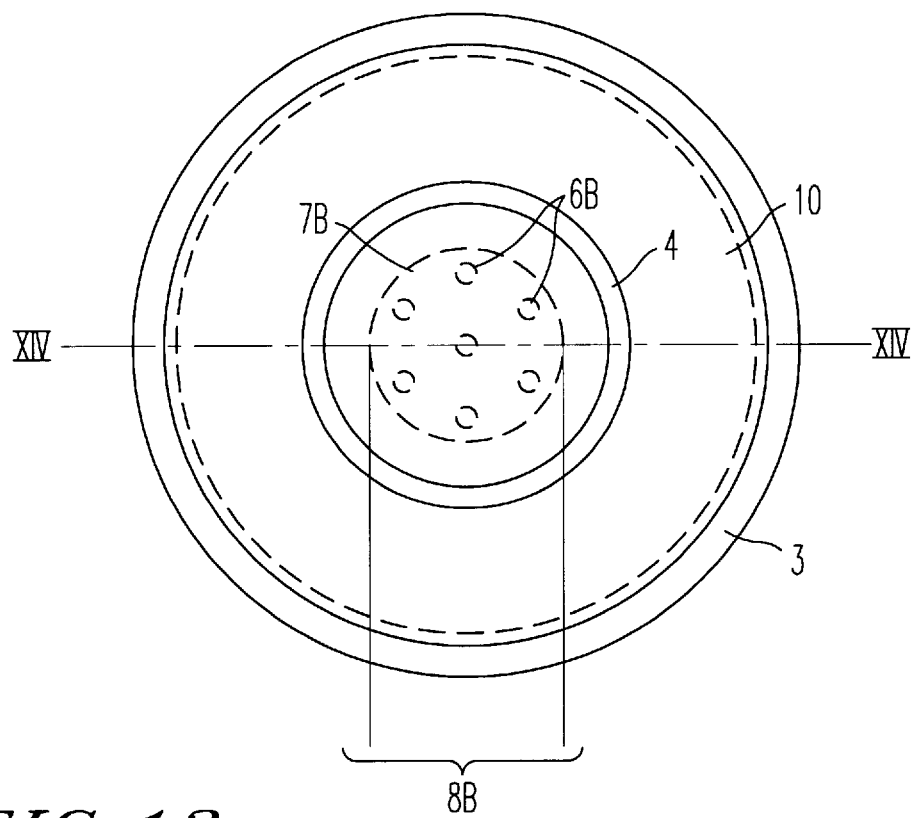
FIG. 13 is a plan view showing an optical trigger thyristor according to a third embodiment of the present invention.
Figure 14:
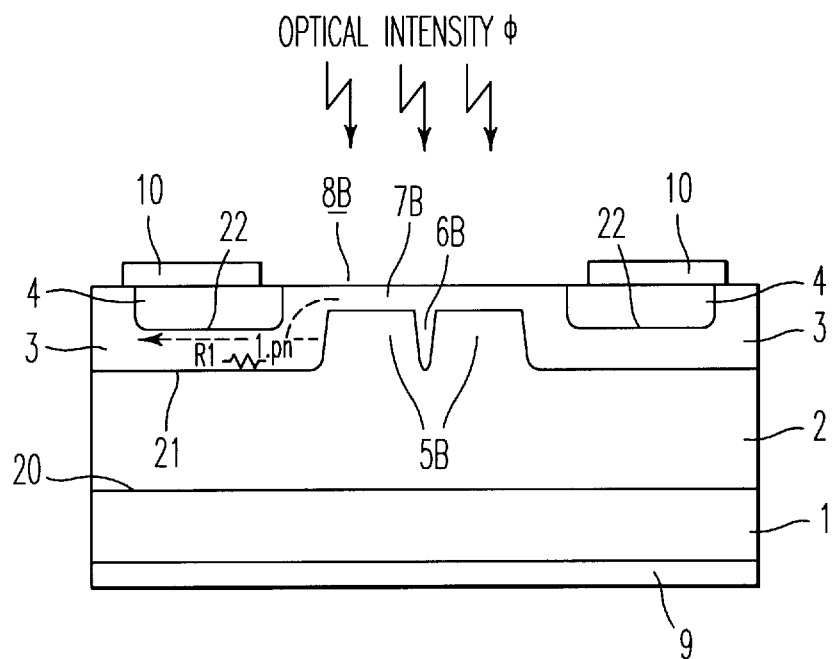
FIG. 14 is a sectional view showing the optical thyristor according to the third embodiment of the invention.

FIG. 13 is a plan view showing an optical trigger thyristor according to a further embodiment of the invention. FIG. 14 is a sectional view showing an optical trigger thyristor taken along line XIV—XIV of FIG. 13.

In this embodiment, an n-type base layer front surface portion 5B and a p-type front surface layer 7B form a light receiving portion 8B as shown in FIG. 14. A p-type semiconductor region 6B is constructed of a plurality of independent partial regions as shown in FIGS. 13 and 14. The partial regions are discretely formed. In particular, one partial region of the p-type semiconductor region 6B is disposed at the center of a circular p-type base layer 3. The other partial regions of the p-type semiconductor region 6B are disposed in a network shape of which three adjacent partial regions of the p-type semiconductor region 6B form a regular triangle.

The other elements of the third embodiment are the same as the construction of the first embodiment.

Thus, because the partial regions of the p-type semiconductor region 6B are discretely formed, the depletion region of the light receiving portion can be widened and carriers can be increased. Consequently, the arc sensitivity can be improved. It is not necessary to dispose one point of the network composed of regular triangles at the center of the p-type base layer 3. However, according to the third embodiment, since one partial region of the p-type semiconductor region 6B is disposed at the center of the circular p-type base layer 3, the electric field can be prevented from concentrating in a shape corresponding to the shape of the circular p-type base layer 3.

In addition, the gap distance of the p-type front surface layer 7B can be properly and compactly designated in a narrow area.

In this case, as with the embodiment shown in FIG. 8, the distance between each partial region of the p-type semiconductor region 6B is in the range from 70 microns~180 microns preferably, in the range from 90 microns to 150 microns.

Figure 15:
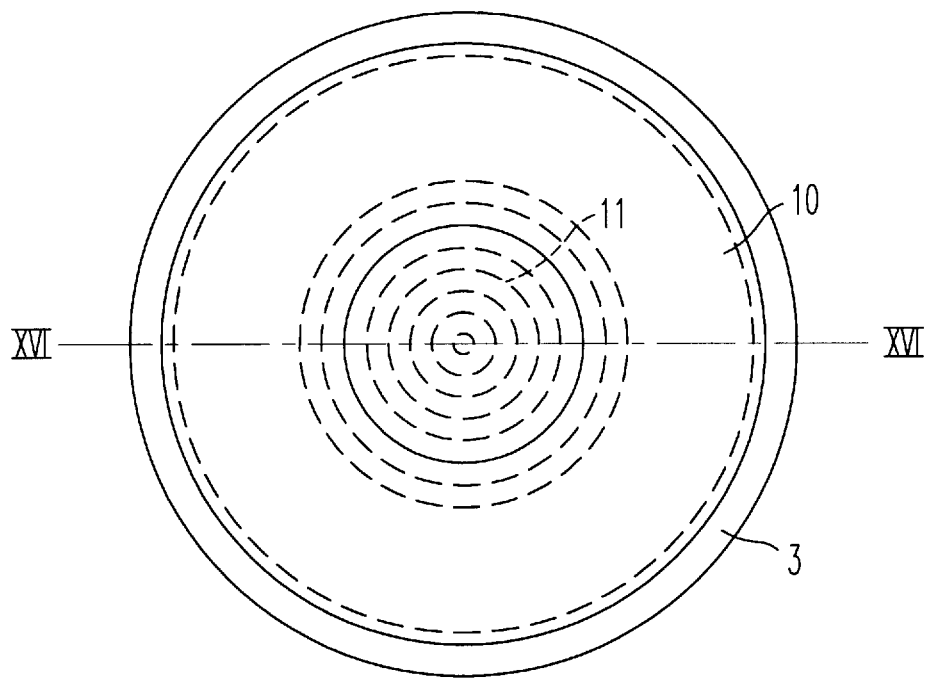
FIG. 15 is a plan view showing an optical trigger thyristor according to a fourth embodiment of the invention.
Figure 16:
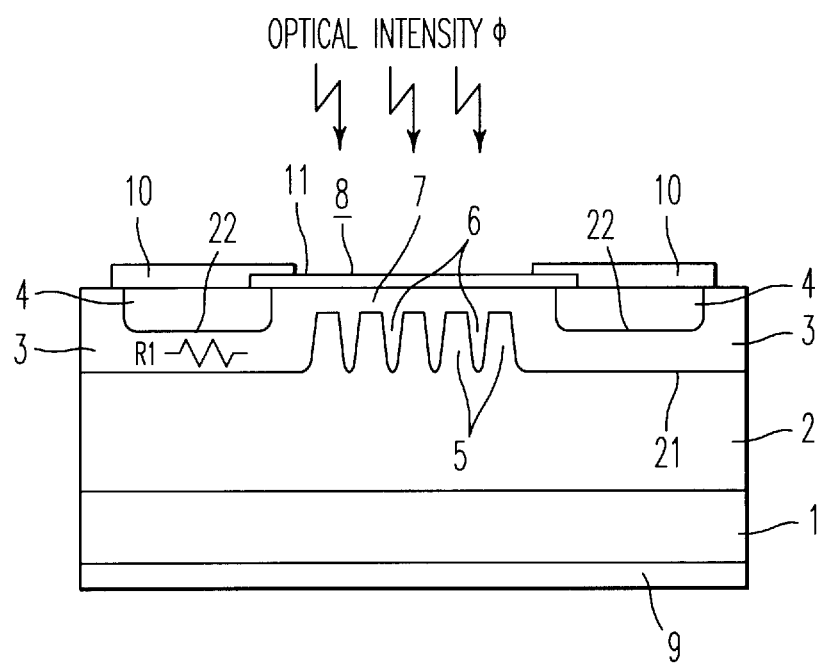
FIG. 16 is a sectional view showing the optical thyristor according to the fourth embodiment of the invention.
Figure 17:
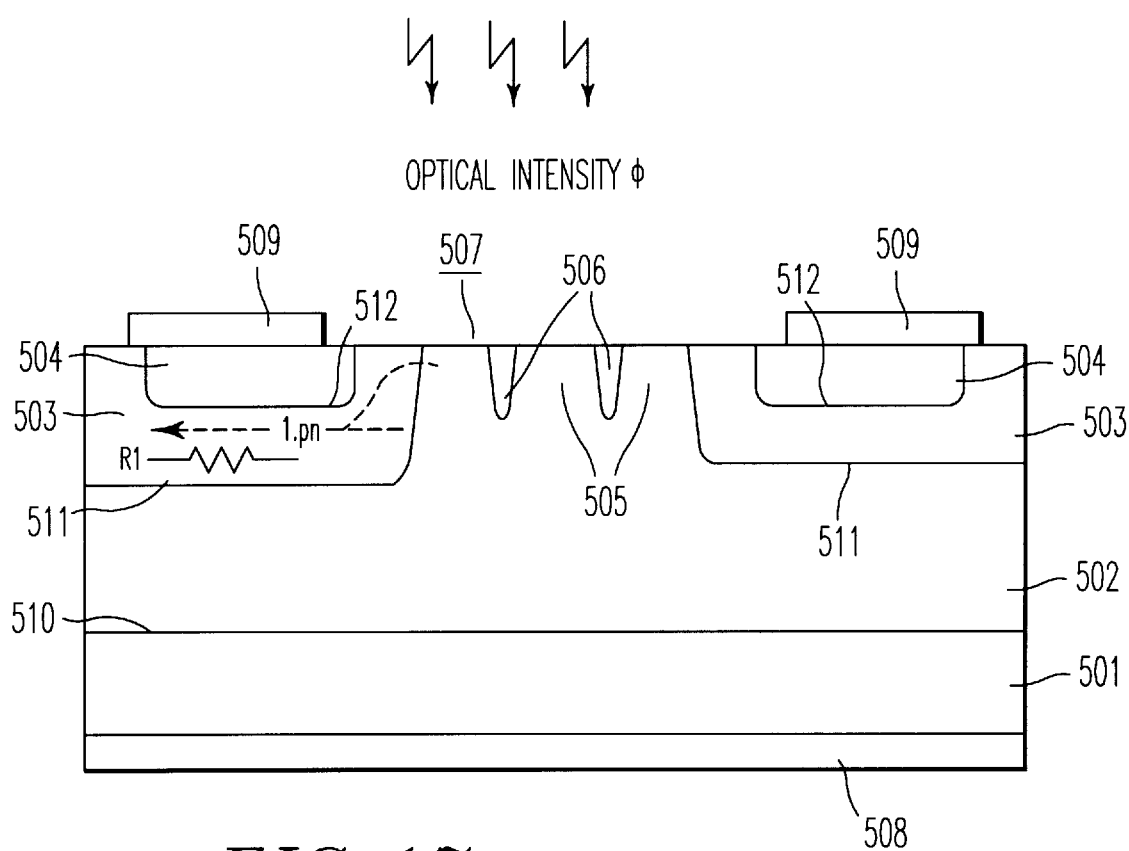
FIG. 17 is a sectional view showing a conventional optical trigger thyristor.
Figure 3:
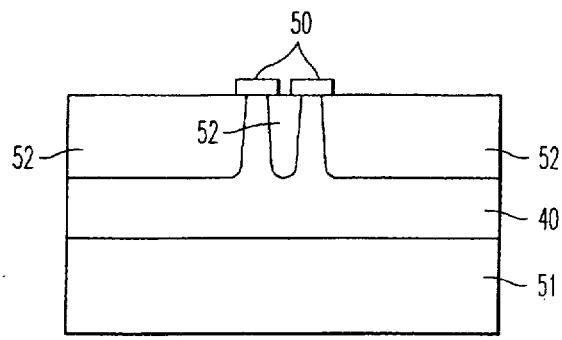
Figure 4:
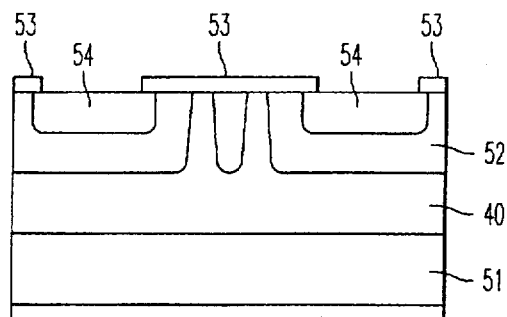
Figure 5:
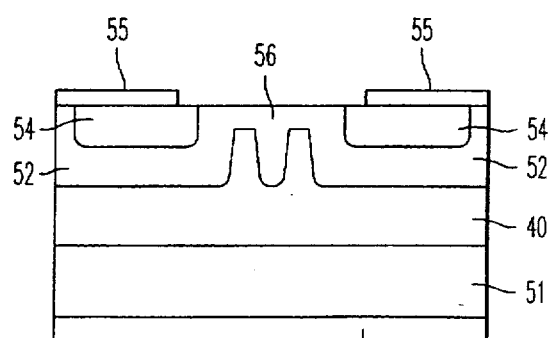
Figure 3:
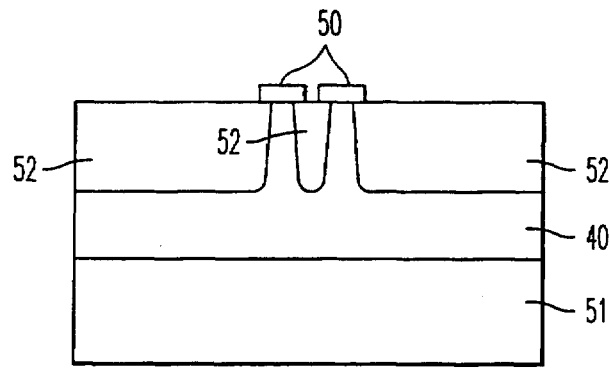
Figure 4:
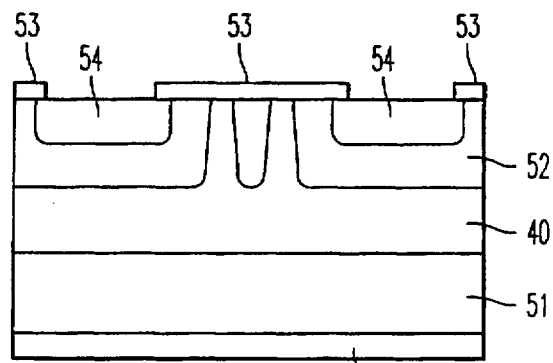
Figure 5:
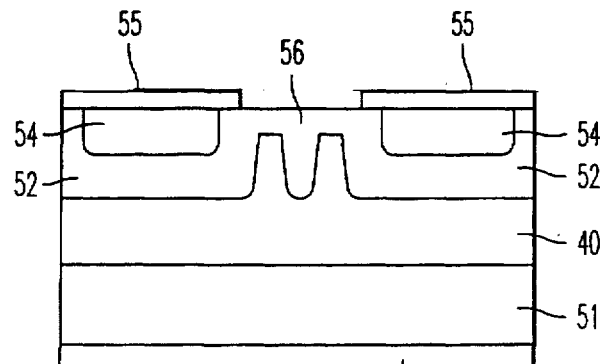

FIG. 15 is a plan view showing an optical trigger thyristor according to a fourth embodiment of the present invention. FIG. 16 is a sectional view showing the optical trigger thyristor taken along line XVI—XVI of FIG. 15.

In FIGS. 15 and 16, reference numeral 11 is a reflection preventing film which is an oxide insulation film (composed of for example silicon oxide or tantalum oxide) or a nitride insulation film (composed of for example silicon nitride).

The reflection preventing film 11 prevents an optical signal from being reflected. To improve the arc sensitivity and effectively guide the optical signal to the light receiving portion 8, the thickness of the reflection preventing film 11 is designated in the range expressed by expression (2) corresponding to a value A given by expression (1).

$$A = (2n-1)\lambda/(4N) \qquad (1)$$

where n is a natural number, λ is the center wavelength of the optical signal, and N is the refractive index of the insulation film.

$$A - 30 \text{ mm} \leq t \leq A + 30 \text{ mm} \qquad (2)$$

where t is the thickness of the reflection preventing film 11.

The reflection preventing film 11 covers the light receiving portion 8, the part of the p-type base layer 3 which surrounds the light receiving portion 8, and a part of an n-type emitter layer 4 through an inner peripheral junction of the p-type base layer 8 and the n-type emitter layer 4. In addition, an inner peripheral portion of a cathode electrode 10 is covered by the outer peripheral portion of the reflection preventing film 11.

The other elements of the fourth embodiment are the same as that of the first embodiment.

Next, the operation of the optical trigger thyristor according to the fourth embodiment will be described.

When an optical signal φ is radiated to the light receiving portion 8, light also enters into the n-type emitter layer 4 adjacent to the light receiving portion 8. Thus, an optical current is generated in the n-type emitter layer 4. The optical current flows from the n-type emitter layer 4 to the cathode electrode 10.

At this point, since the n-type emitter layer 4 has a small resistance component, a reverse bias is applied to a J3 junction 22 which is formed by the n-type emitter layer 4 and the p-type base layer 3. The reverse bias causes an optical current Iph generated in the light receiving portion 8 to horizontally flow in the p-type base layer 3 to offset the forward bias generated by the resistance R1 at the J3 junction 33. Thus, the reverse bias prevents the forward bias from exceeding a threshold voltage of the J3 junction 22, thereby decreasing the arc sensitivity. However, according to the fourth embodiment, the reflection preventing film 11 is disposed between the cathode electrode 10 and the inner periphery side of the p-type base layer 3 so as to insulate them. In addition, the cathode electrode 10 prevents the optical signal from entering the n-type emitter layer 4. Thus, since the J3 junction 22 is not reversibly biased, the arc sensitivity is improved.

Because of the above-described features of the embodiment the following effects I–XV are provided:

I. According to the optical trigger thyristor of the first aspect of the invention, because the front surface portion of the semiconductor substrate, which tends to be easily contaminated, is covered by the fourth semiconductor layer, contamination of the optical trigger thyristor can be prevented. Because the concentration of impurities of the front surface portion of the semiconductor substrate does not vary, the arc sensitivity becomes high and the voltage blocking characteristic does not deteriorate.

II. According to the optical trigger thyristor of the second aspect of the invention, because the front surface portion of the semiconductor substrate, which tends to be easily contaminated, is covered by the fourth semiconductor layer, contamination of the optical trigger thyristor can be prevented. The concentration of impurities at the front surface portion of the semiconductor substrate does not change. In addition, the first semiconductor layer is disposed so that it surrounds a part of the front surface of the semiconductor substrate. Moreover, since the second semiconductor layer is disposed on the first semiconductor layer along the periphery of the front surface of the semiconductor substrate surrounded by the first semiconductor layer, the optical current effectively flows in the first semiconductor layer. Thus, since the voltage drop in the first semiconductor layer becomes large, the arc sensitivity becomes high and the voltage blocking characteristic does not deteriorate. Thus, an optical trigger thyristor with a high reliability can be provided.

III. According to the optical trigger thyristor of the third aspect of the invention, because the third semiconductor layer or the fourth semiconductor layer is composed of a plurality of partial regions, even if the front surface of the semiconductor substrate surrounded by the first semiconductor layer widens, the distance between each partial region of the third semiconductor layer can be properly designated. Thus, since the region in which carriers are generated widens, the electric field can be prevented from concentrating.

IV. According to the optical trigger thyristor of the fourth aspect of the invention, the third semiconductor layer or the fourth semiconductor layer is constructed of a plurality of independent partial regions. In addition, the first semiconductor layer is formed in a ring shape. Moreover, the partial regions are formed in ring shapes which are concentric circles of the first semiconductor layer. Thus, there is no wasting of the area which correspond to the shape of the first semiconductor layer, and which is the area of the front surface of the semiconductor substrate surrounded by the first semiconductor layer. Furthermore, because each of the intervals of the third semiconductor layers can be properly disposed, the arrangement for corresponding to the shape of the region in which carriers are generated can be designed to achieve good balance and to prevent the electric field from concentrating.

V. According to the optical trigger thyristor of the fifth aspect of the invention, because a plurality of partial regions are discretely formed, the area of the third semiconductor layer is smaller than the area of the front surface of the semiconductor substrate surrounded by the first semiconductor layer. Thus, because the depletion region widens, carriers can be increased and the arc sensitivity can be improved.

VI. According to the optical trigger thyristor of the sixth aspect of the invention, because the partial regions are formed in a network shape of which three adjacent partial regions form a regular triangle, the distance between each partial region of the third semiconductor layer can be properly designated. Thus, the arrangement can be designed to achieve for good balance and to prevent the electric field from being concentrated.

VII. According to the optical trigger thyristor of the seventh aspect of the invention, because the first semiconductor layer is formed in a ring shape and one of the partial regions is formed at the center of the ring of the first semiconductor layer, the distance between each partial region of the third semiconductor layer can be properly designated to correspond to the shape of the front surface of the semiconductor substrate surrounded by the first semiconductor layer. Thus, the arrangement for corresponding to the shape of the region in which carriers are generated can be designed for good balance and to prevent the electric field from being concentrated.

VIII. According to the optical trigger thyristor of the eighth aspect of the invention, with the distance between the first semiconductor layer and the third semiconductor layer or the distance between each partial region of the third semiconductor layers being in the range from 70 microns to 180 microns, preferably, in the range from 90 microns to 150 microns, the arc sensitivity and the voltage blocking characteristic can be well balanced and thereby the reliability of the optical trigger thyristor is improved.

IX. According to the optical trigger thyristor of the ninth aspect of the invention, because the insulation film is disposed on the front surfaces of the third semiconductor layer and the fourth semiconductor layer, reflection of the optical signal can be prevented and the arc sensitivity can be improved.

X. According to the optical trigger thyristor of the tenth aspect of the invention, because the insulation film is disposed on the front surface of the first semiconductor layer adjacent to the fourth semiconductor layer so that it is disposed between the first main electrode and the first semiconductor layer, the fourth semiconductor layer can be covered by the first main electrode. Thus, a reverse bias due to the optical signal can be prevented from being generated in the fourth semiconductor layer and the optical signal can be effectively used.

XI. According to the optical trigger thyristor of the eleventh aspect of the invention, because the insulation film extends over the junction of the first semiconductor layer and the second semiconductor layer adjacent to the fourth semiconductor layer and is disposed between the first main electrode and the first semiconductor layer, the optical signal can be effectively guided to the light receiving portion and the reverse bias due to the optical signal can be prevented from being generated in the fourth semiconductor layer. Thus, the optical signal can be effectively used.

XII. According to the optical trigger thyristor of the twelfth aspect of the invention, because the insulation film is composed of silicon oxide, silicon nitride, or tantalum oxide, the material of the insulation film is easily obtained and thus the cost of the optical trigger thyristor is reduced.

XIII. According to the optical trigger thyristor of the thirteenth aspect of the invention, since the thickness of the insulation film is given by $A-30 \leq t \leq A+30$ (unit: mm) {where A is $(2n-1)\lambda/(4N)$, n is a natural number, $\lambda$ is the center wavelength of the optical signal, N is the refractive index of the insulation film, and t is the thickness of the insulation film}, reflection of the optical signal can be prevented and the optical signed can be effectively guided to the light receiving portion. Thus, the optical signal can be effectively used.

XIV. According to the fabrication method of the optical trigger thyristor of the fourteenth aspect of the invention, because the front surface portion of the semiconductor substrate, which tends to be easily contaminated is covered by the fourth semiconductor layer, the concentration of impurities of the front surface portion of the semiconductor substrate does not vary. By the simple fabrication method, the optical trigger thyristor having a high arc sensitivity and a voltage blocking characteristic which does not deteriorate can be provided at a low cost.

XV. According to the fabrication method of the optical trigger thyristor of the fifteenth aspect of the invention, impurities are diffused so that the impurity region corresponding to the opening of the island shape region is overlapped with the non-impurity region adjacent to the impurity region through the semiconductor substrate in the vicinity of the front surface of the semiconductor substrate. Thus, the front surface portion of the semiconductor substrate, which tends to be easily contaminated, is covered. In addition, the front surface portion of the semiconductor substrate can be covered without need to perform a diffusion step. Consequently, the optical trigger thyristor having a high arc sensitivity and a non-deteriorating voltage blocking characteristic can be provided at a low cost.

The invention has been described with respect to certain preferred embodiments. Various modifications and additions within the spirit of the invention will occur to those skilled in the art. Accordingly, the scope of the invention is limited solely by the following claims.

What is claimed as new and desired to be secured by Letters Patent of the United States is:

1. An optical trigger thyristor, comprising:
    a first conductivity type semiconductor substrate having a first and a second main surface side;
    a second conductivity type first semiconductor layer disposed on a part of a front surface on the first main surface side of said semiconductor substrate;
    a first conductivity type second semiconductor layer disposed in an island shape on a front surface of said first semiconductor layer;
    a second conductivity type third semiconductor layer disposed in an island shape on a part of the front surface on the first main surface side of said semiconductor substrate, and constructing a part of a light receiving portion;
    a second conductivity type fourth semiconductor layer adapted for connecting said third semiconductor layer and said first semiconductor layer, said fourth semiconductor layer constructing a part of the light receiving portion, and the depth of which is shallower than the depth of said third semiconductor layer disposed on a part of the front surface on the first main surface side of said semiconductor substrate;

a second conductivity type fifth semiconductor layer disposed on a front surface of the second main surface side of said semiconductor substrate;

a first main electrode adapted for connecting said first semiconductor layer and said second semiconductor layer, and disposed on the first main surface side of said semiconductor substrate;

a second main electrode connected to said fifth semiconductor layer and disposed on the front surface of said fifth semiconductor layer; and wherein at least one of said third and fourth semiconductor layers is composed of a plurality of independent partial regions.

2. The optical trigger thyristor as set forth in claim 1, wherein said partial regions are composed of a plurality of discrete portions.

3. The optical trigger thyristor as set forth in claim 2, wherein said partial regions are formed in a mesh of a net shape configured as an equilateral triangle.

4. The optical trigger thyristor as set in claim 3, wherein said first semiconductor layer is formed in a ring shape, and wherein one of said partial regions is formed at the center of the ring of said first semiconductor layer.

5. The optical trigger thyristor as set forth in claim 1, wherein the distance between said first and third semiconductor layers or the distance between each partial region of said third semiconductor layer is in the range from 70 microns to 180 microns, preferably in the range from 90 microns to 150 microns.

6. The optical trigger thyristor as set forth in claim 1, further comprising:

an insulation film disposed on front surfaces of said third and fourth semiconductor layers.

7. The optical trigger thyristor as set forth in claim 1, further comprising:

an insulation film disposed on a front surface of said first semiconductor layer adjacent to said fourth semiconductor layer so that said insulation film is disposed between said first main electrode and said first semiconductor layer.

8. The optical trigger thyristor as set forth in claim 6, wherein said insulation film covers the junction of said first and second semiconductor layer on the side adjacent to said fourth semiconductor layer and is disposed between said first main electrode and said first semiconductor layer.

9. The optical trigger thyristor as set forth in claim 6, wherein said insulation film is composed of silicon oxide, silicon nitride, or tantalum oxide.

10. The optical trigger thyristor as set forth in claim 6, wherein the thickness of said insulation film is given by $\{A-30 \text{ mm}\} \leq t \leq \{A+30 \text{ mm}\}$ where t is the thickness of said insulation film, and A is $(2n-1)\lambda/(4N)$ where $\lambda$ is the center wavelength of an optical signal, n is a natural number, N is the refractive index of the insulation film.

11. An optical trigger thyristor, comprising:

a first conductivity type semiconductor substrate having a first and a second main surface side;

a second conductivity type first semiconductor layer disposed on a first part of a front surface on the first main surface side of said semiconductor substrate so that said first semiconductor layer surrounds a second part of the front surface on said first main surface side;

a first conductivity type second semiconductor layer disposed in an island shape on a front surface of said first semiconductor layer along the periphery of said first part of the front surface of said semiconductor substrate;

a second conductivity type third semiconductor layer disposed in an island shape on said second part of the front surface of said semiconductor substrate surrounded by the first semiconductor layer, and constructing a part of a light receiving portion;

a second conductivity type fourth semiconductor layer adapted for connecting said third semiconductor layer and said first semiconductor layer, said fourth semiconductor layer constructing a part of the light receiving portion, and the depth of which is shallower than the depth of said third semiconductor layer disposed on said second part of the front surface of the semiconductor substrate;

a second conductivity type fifth semiconductor layer disposed on a front surface of the second main surface side of the semiconductor substrate;

a first main electrode adapted for connecting said first semiconductor layer and said second semiconductor layer, and disposed on the first main surface side of said semiconductor substrate; and a second main electrode connected to said fifth semiconductor layer, and disposed on a front surface of the fifth semiconductor layer; and wherein at least one of said third and fourth semiconductor layers is composed of a plurality of independent partial regions.

12. The optical trigger thyristor as set forth in claim 11, wherein said partial regions are composed of a plurality of discrete portions.

13. The optical trigger thyristor as set in claim 12, wherein said first semiconductor layer is formed in a ring shape, and wherein one of said partial regions is formed at the center of the ring of said first semiconductor layer.

14. The optical trigger thyristor as set forth in claim 11, wherein the distance between said first and third semiconductor layers or the distance between each partial region of said third semiconductor layer is in the range from 70 microns to 180 microns, preferably in the range from 90 microns to 150 microns.

15. The optical trigger thyristor as set forth in claim 11, further comprising:

an insulation film is disposed on the front surfaces of said third and fourth semiconductor layers.

16. The optical trigger thyristor as set forth in claim 15, wherein the thickness of said insulation film is given by $\{A-30 \text{ mm}\} \leq t \leq \{A+30 \text{ mm}\}$ where t is the thickness of said insulation film, and A is $(2n-1)\lambda/(4N)$, n is a natural number, $\lambda$ is the center wavelength of an optical signal, N is the refractive index of the insulation film.

* * * * *

UNITED STATES PATENT AND TRADEMARK OFFICE
CERTIFICATE OF CORRECTION

Figure 5:
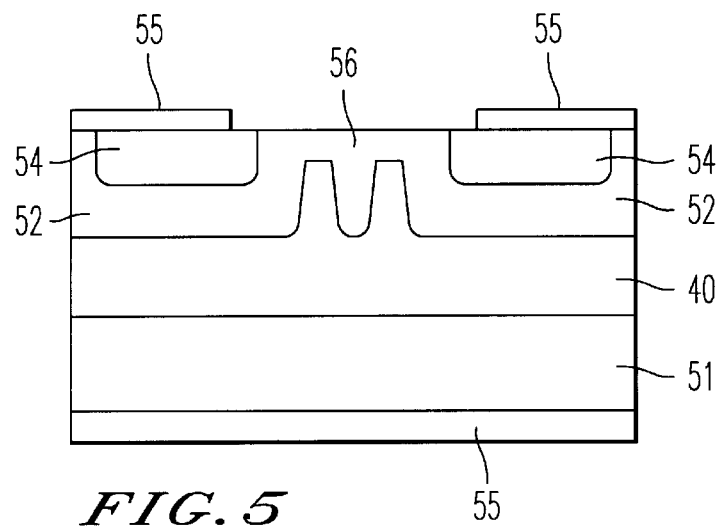
Figure 6:
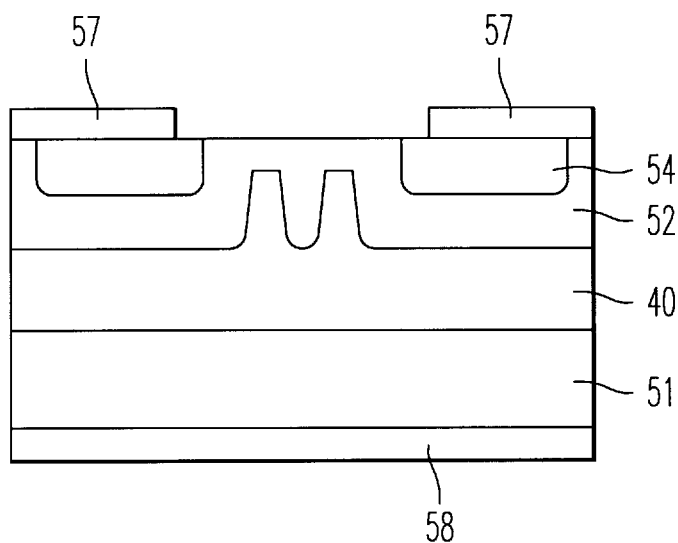

PATENT NO.  : 5,804,841
DATED       : September 8, 1998
INVENTOR(S) : Satoh et al It is certified that error appears in the above-identified patent and that said Letters Patent is hereby corrected as shown below:

The Drawing Sheet, consisting of Fig.5, should be deleted to be replaced with the Drawing Sheet, consisting of Fig. 5, as shown on the attached page.

Signed and Sealed this

Seventh Day of November, 2000

Attest:

Q. TODD DICKINSON

Attesting Officer

Director of Patents and Trademarks

UNITED STATES PATENT AND TRADEMARK OFFICE
CERTIFICATE OF CORRECTION

| | |
|---|---|
| PATENT NO. | : 5,804,841 |
| DATED | : September 8, 1998 |
| INVENTOR(S) | : Katsumi Satoh et al. |

It is certified that error appears in the above-identified patent and that said Letters Patent is hereby corrected as shown below:

The Drawing Sheet, consisting of Fig. 5, should be deleted to be replaced with the Drawing Sheet, consisting of Fig. 5. as shown on the attached page.

Signed and Sealed this

Eighteenth Day of December, 2001

*Attest:*

*Attesting Officer*

JAMES E. ROGAN
*Director of the United States Patent and Trademark Office*